(12) United States Patent
Ishikawa et al.

(10) Patent No.: US 6,445,277 B1
(45) Date of Patent: Sep. 3, 2002

(54) SAFETY DEVICE OF ELECTRIC CIRCUIT AND PROCESS FOR PRODUCING THE SAME

(75) Inventors: Satoshi Ishikawa; Osamu Soda; Hisafumi Maruo, all of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 147 days.

(21) Appl. No.: 09/598,694

(22) Filed: Jun. 21, 2000

(30) Foreign Application Priority Data

Jun. 22, 1999 (JP) ............................. 11-175025

(51) Int. Cl.$^7$ ..................... H01H 85/08; H01H 85/046; H01H 37/02
(52) U.S. Cl. .................. 337/297; 337/290; 337/401; 337/404; 337/405; 361/104
(58) Field of Search .................. 337/290, 297, 337/295, 296, 159, 401–405, 416, 293; 29/623; 361/103, 104

(56) References Cited

U.S. PATENT DOCUMENTS

| | | | | |
|---|---|---|---|---|
| 3,649,942 A | * | 3/1972 | Plasko | 337/163 |
| 3,882,438 A | * | 5/1975 | Bourner | 219/517 |
| 4,016,521 A | * | 4/1977 | Seybold | 337/163 |
| 4,652,848 A | * | 3/1987 | Hundrieser | 337/297 |
| 4,677,412 A | * | 6/1987 | Sibalis | 337/401 |
| 4,808,960 A | * | 2/1989 | Nixon | 337/102 |
| 4,821,010 A | * | 4/1989 | Plasko | 337/183 |
| 5,084,691 A | * | 1/1992 | Lester et al. | 337/166 |
| 5,097,247 A | * | 3/1992 | Doerrwaechter | 29/623 |
| 5,153,805 A | * | 10/1992 | Tennant et al. | 361/106 |
| 5,708,553 A | * | 1/1998 | Hung | 337/114 |
| 5,712,610 A | * | 1/1998 | Takeichi et al. | 337/290 |
| 6,198,376 B1 | * | 3/2001 | Ishikawa et al. | 337/159 |
| 6,232,868 B1 | * | 5/2001 | Rehnelt | 338/195 |

FOREIGN PATENT DOCUMENTS

| | | | | |
|---|---|---|---|---|
| JP | 1-129744 | | 9/1989 | |
| JP | 2-288126 | * | 11/1990 | 337/416 |
| JP | 4-56028 | | 2/1992 | |
| JP | 4-94027 A | * | 3/1992 | 337/290 |
| JP | 4-351877 | * | 12/1992 | H05B/3/16 |
| JP | 8-250304 | | 9/1996 | |
| JP | 9-161635 | | 6/1997 | |

* cited by examiner

*Primary Examiner*—Anatoly Vortman
(74) *Attorney, Agent, or Firm*—Armstrong, Westerman & Hattori, LLP

(57) ABSTRACT

A safety device of an electric circuit is provided, in which a thermal fuse securely prevents an accident from occurring when an overcurrent protector is extraordinarily overheated. The safety device includes: first protective means in an overcurrent protector for protecting the electric circuit from an overcurrent, which generates heat to increase its electrical resistance when an overcurrent flows in the electric circuit, whereby reducing or cutting off the overcurrent; and second protective means including a thermal fuse situated in the vicinity of the overcurrent protector containing: a first electrode having a first conductor pattern connected to the overcurrent protector; a second electrode having a second conductor pattern insulated from the first electrode by a gap; and solder connecting the first and second electrodes and melting by heat from the overcurrent protector so as to split into two parts toward the first and second electrodes. According to the safety device, the thermal fuse can quickly operate when the overcurrent protector is extraordinarily overheated and be easily formed by employing an automatic soldering machine and the like.

15 Claims, 8 Drawing Sheets

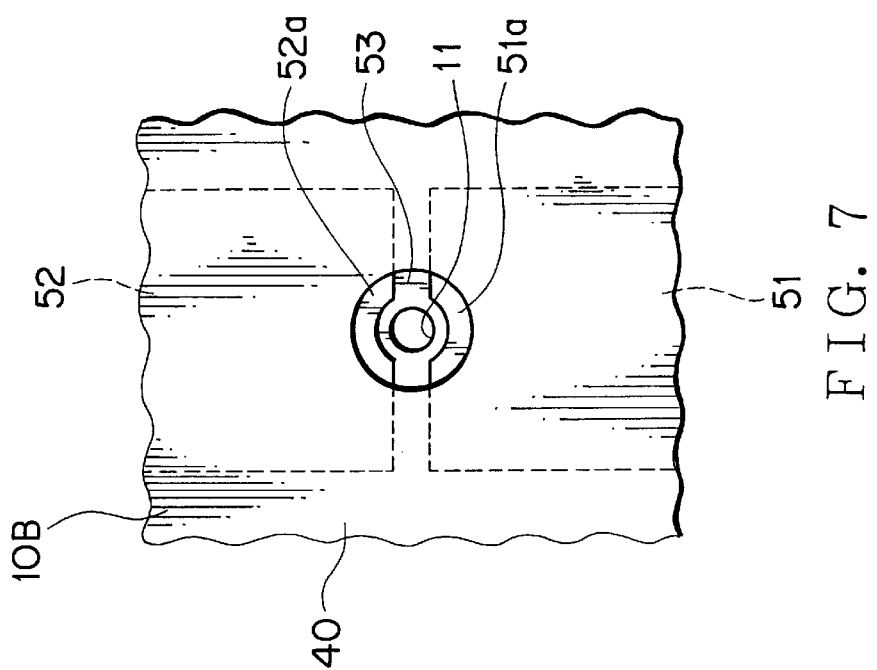
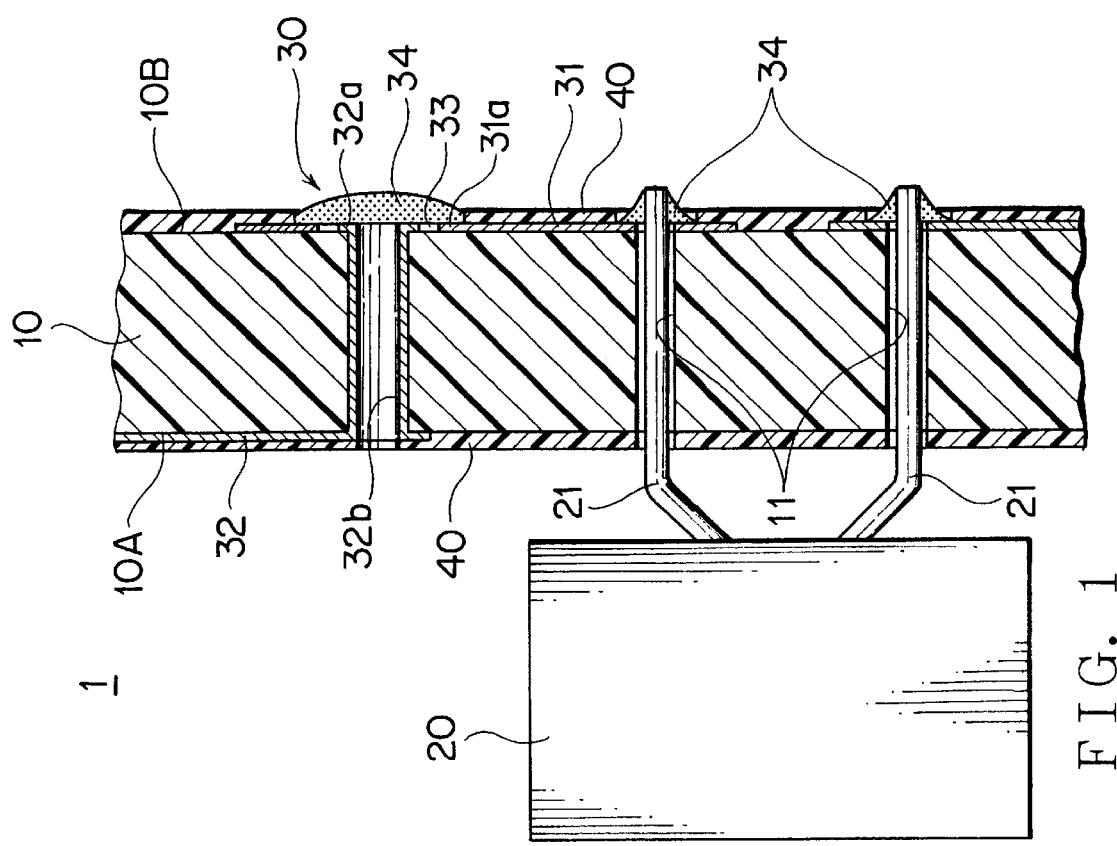

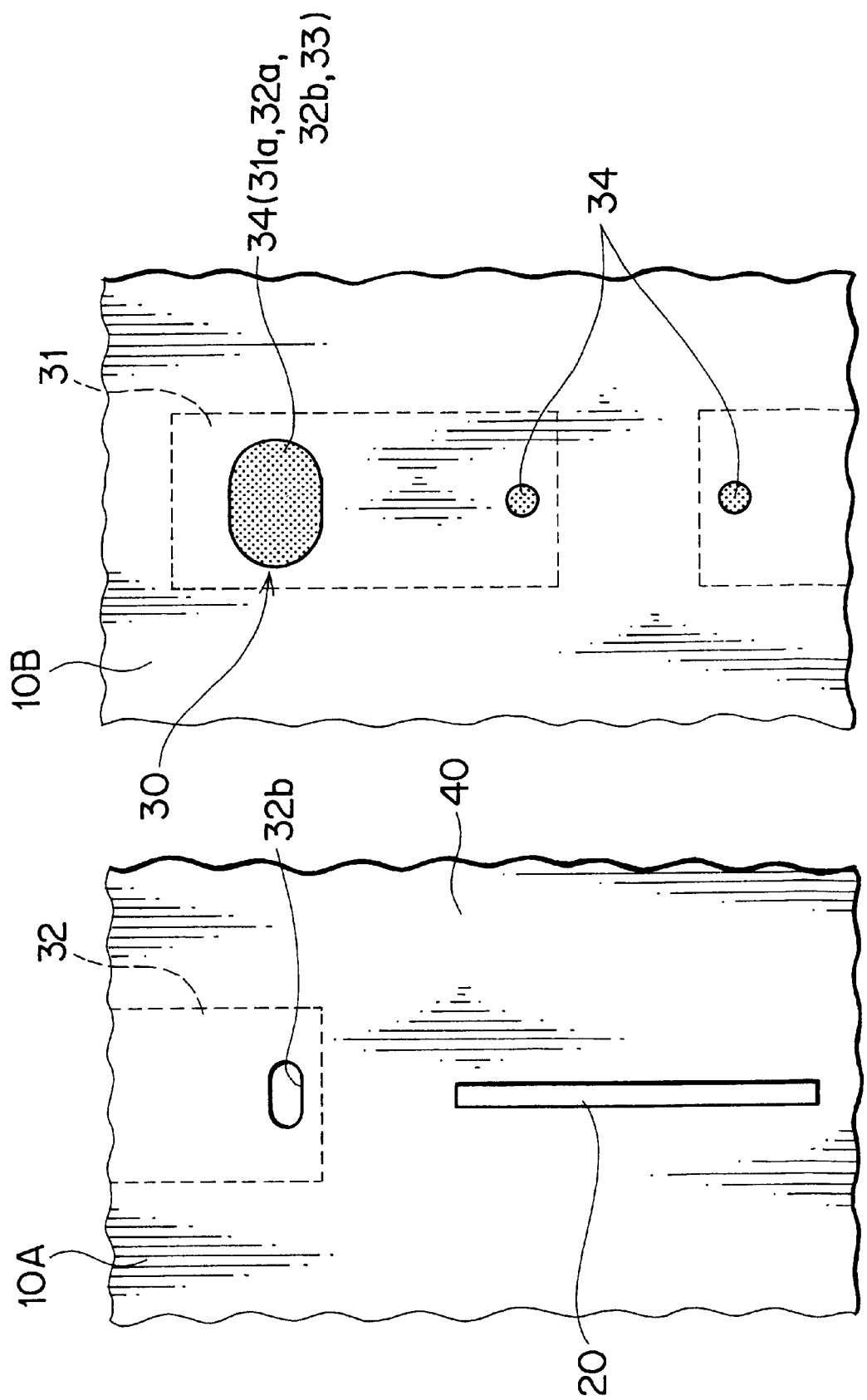

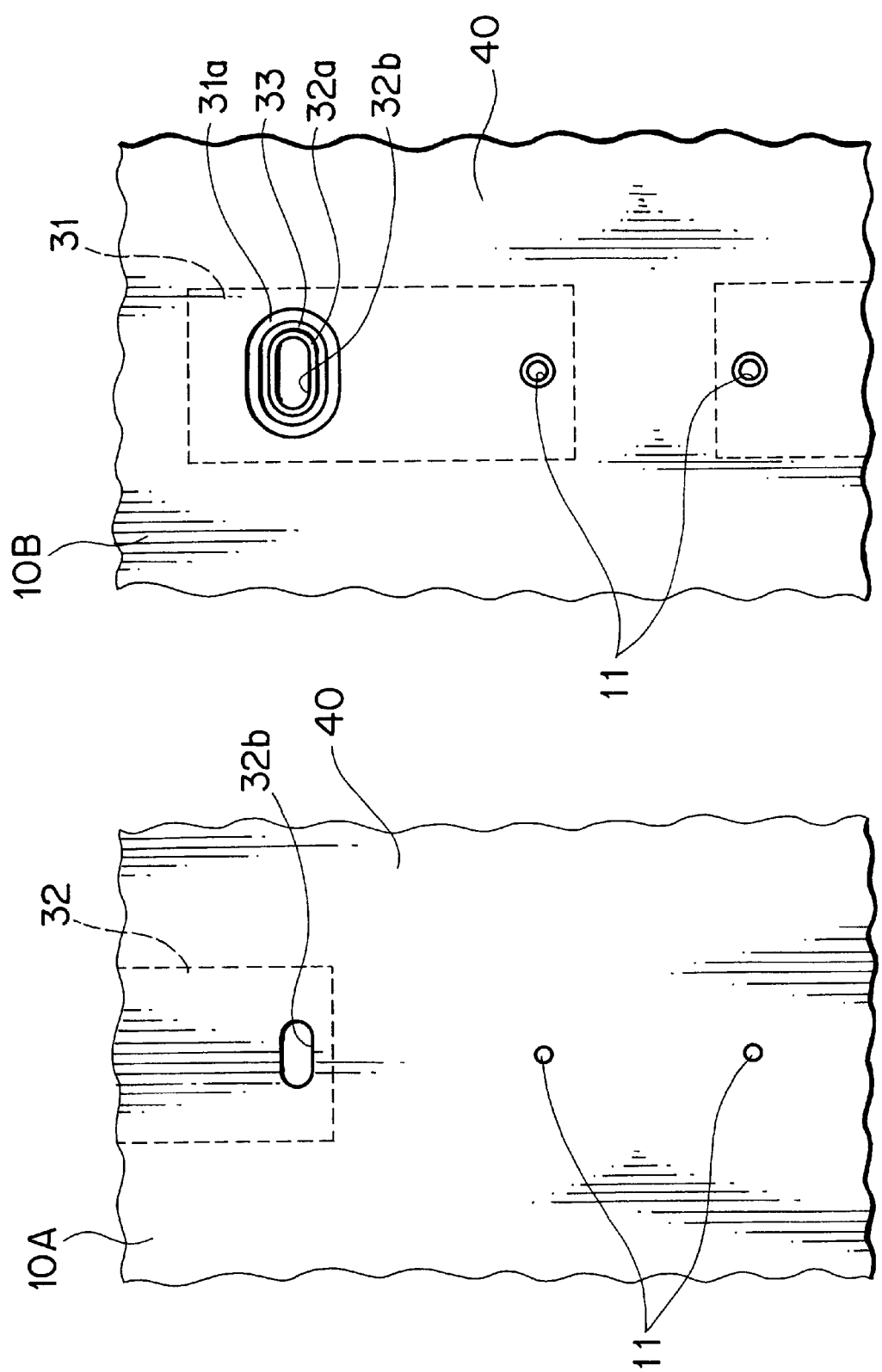

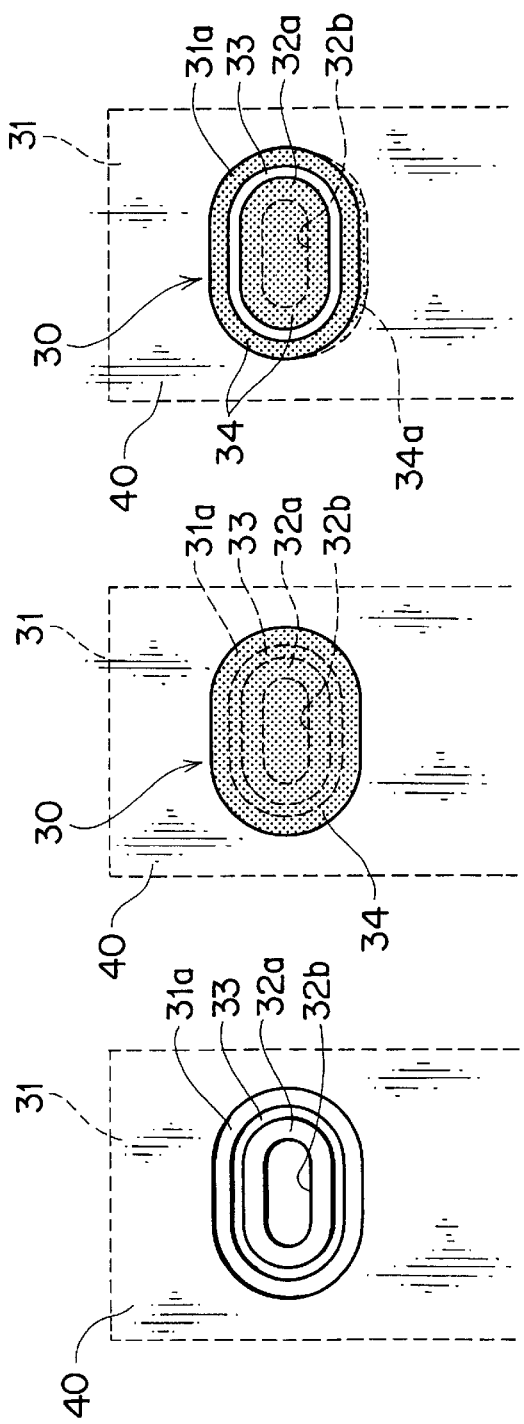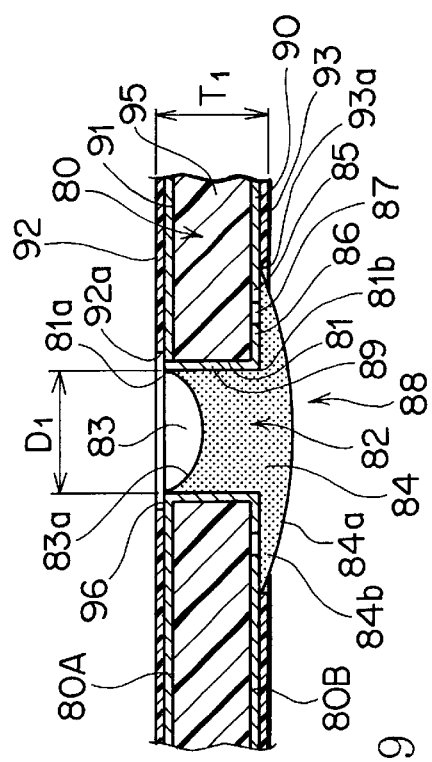

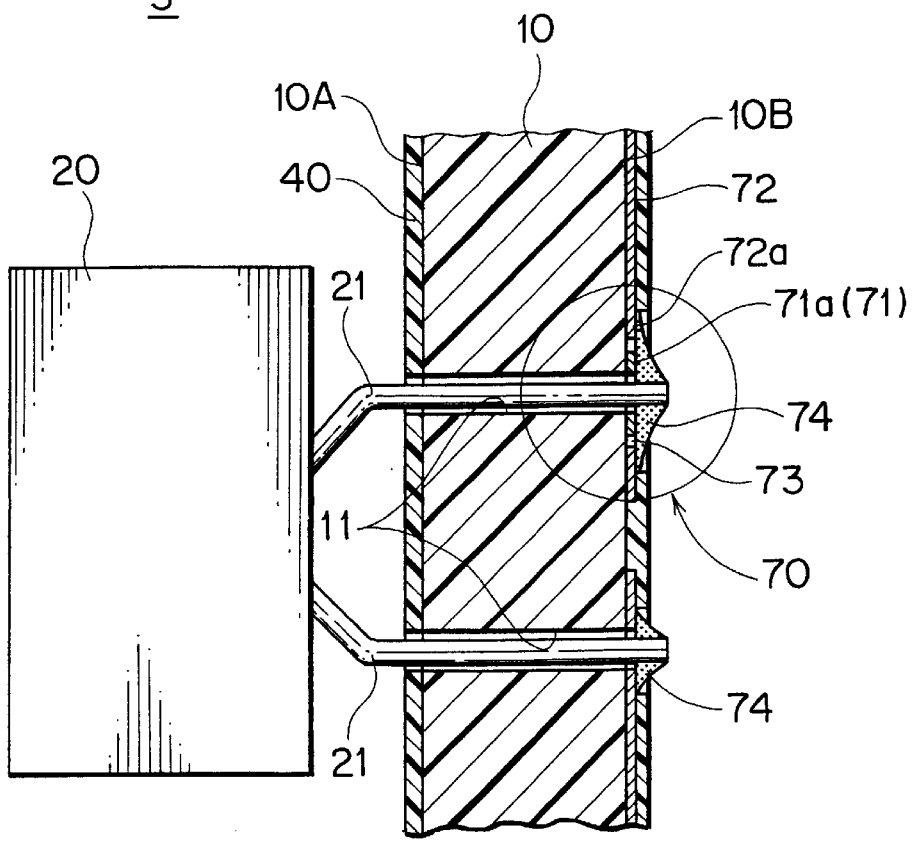
FIG. 8
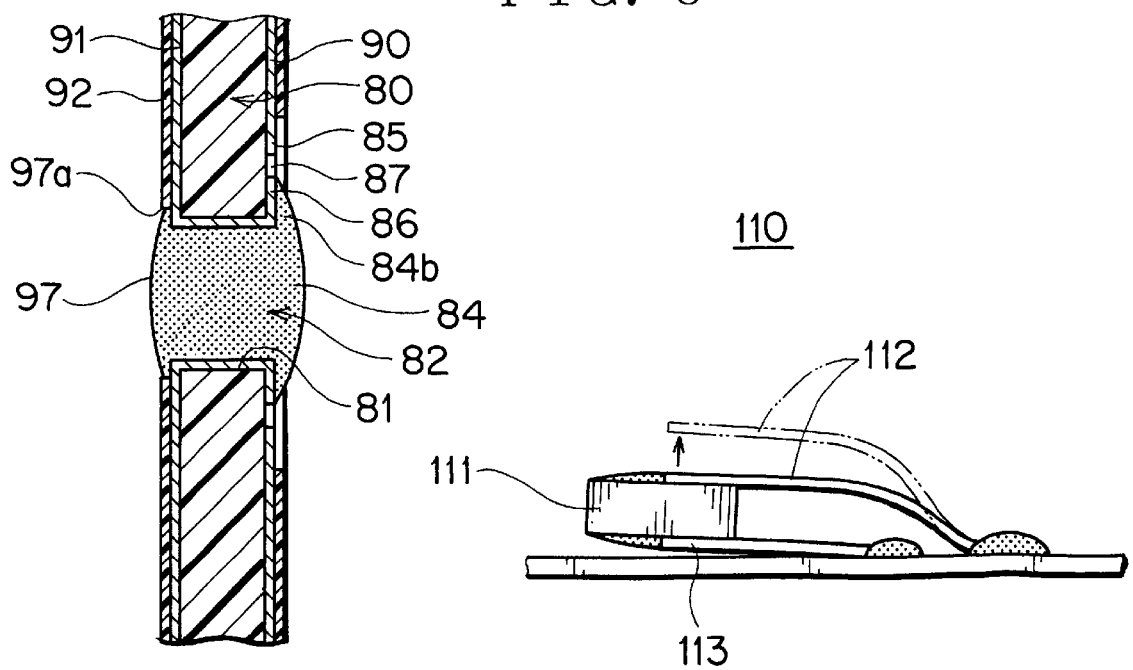
FIG. 10
PRIOR ART
FIG. 13

SAFETY DEVICE OF ELECTRIC CIRCUIT AND PROCESS FOR PRODUCING THE SAME

BACKGROUND OF THE INVENTION (1) Field of the Invention

This invention relates to a safety device of an electric circuit for preventing an accident due to an overcurrent from occurring and a process for producing the same and, more specifically, to a safety device of an electric circuit containing first and second protective devices, wherein an accident is securely prevented from occurring by using the second protective device such as a thermal fuse even when the first protective device such as an overcurrent protective element is extraordinarily overheated.

(2) Description of the Related Art

An overcurrent protector is employed in an electric circuit of a power unit and the like mounted on an electric vehicle in order to prevent an accident due to overcurrent from occurring. For example, a positive temperature coefficient (hereinafter, called PTC) element, a variable resistor (hereinafter, called varistor) and an aluminum electrolytic capacitor are used as the overcurrent protector that generates heat to increase its electrical resistance when an overcurrent flows therethrough and then, reduces or cuts off the overcurrent, thereby keeping the electric circuit in secure condition.

However, when the overcurrent is kept flowing to overheat the overcurrent protector extraordinarily and is left as it goes, the overcurrent protector might catch fire to cause a vehicle fire.

Therefore, various measures to cope with the extraordinary overheating of the overcurrent protector have hitherto been proposed.

For example, Japanese Patent Application Laid-Open No. H8-250304 has proposed a safety device 110 of an electric circuit, in which one of a pair of leads 112 and 113 soldered to a PTC element 111 having a spring characteristic with respect to a direction apart from the PTC element 111 as shown in FIG. 13.

According to the above construction, when the PTC element 111 is extraordinarily overheated due to overcurrent, the solder is brought into melted condition and one lead 112 is lifted up to be apart from the PTC element 111, thereby the overcurrent flowing through an electric circuit is cut off.

Japanese Utility Model Application Laid-Open No. H1-129744 has proposed a safety device 120 of an electric circuit, in which a voltage-dependent type varistor (hereinafter, called ZNR) 121 is employed as shown in FIG. 14A.

In the safety device 120, a lead 122 of the ZNR 121 is bended at right angles and soldered to one conductor pattern 123 and another conductor pattern 124 that are separated and insulated from each other on an circuit board, thereby the conductor pattern 123 is connected to the other conductor pattern 124.

According to the above construction, as shown in FIGS. 14A, 14B and 14C, when the ZNR 121 is extraordinarily overheated, solder for fixing the lead 122 melts to force the ZNR 121 to be left out by its own weight, thereby breaking an electrical connection between the conductor pattern 123 and the other conductor pattern 124 and also breaking the overcurrent flowing in the electrical circuit.

The above conventional safety devices 110 and 120 of an electric circuit can prevent an accident due to an extraordinary overheating of an overcurrent protector, however causing the following problems.

In the safety device 110 shown in FIG. 13, the soldering must be done against an elastic force of the lead 112, resulting in time consuming for soldering and that the safety device 110 can not be produced easily by employing an automatic soldering machine and the like.

In the safety device 120 shown in FIG. 14, the soldering must be done with holding the ZNR 121 so that the ZNR 121 is left out by its own weight upon the extraordinary overheating, also resulting in that a lot of time is required for soldering and that the safety device 120 can not be produced easily by employing an automatic soldering machine and the like.

As a result of study, the present inventors have reached a technological idea that a thermal fuse be situated in the vicinity of the overcurrent protector and the thermal fuse detects an extraordinary overheating of the overcurrent protector, thereby the electric circuit is cut off.

In the following, an ordinary thermal fuse is explained with reference to FIGS. 15A, 15B and 15C.

As shown in FIG. 15A, one conductor pattern 132 and another conductor pattern 133 are formed on a circuit board 131, then electrodes 132a and 133a of the conductor pattern 132 and other conductor pattern 133, respectively, are insulated from each other by a gap 134. Then, as shown in FIG. 15B, the electrodes 132a and 133a are connected by bridging the gap 134 with solder 135, thereby a thermal fuse 130 is formed.

According to the above construction, when a temperature of the conductor pattern 132, the other conductor pattern 133 or an atmosphere around the solder 135 rises high, the solder 135 completely melts.

Then, as shown in FIG. 15C, the solder 135 is repeled by an surface of the circuit board, which is hard to be wetted by solder, at the gap 134 and then, splits into two parts toward each electrode 132a and 133a, which are easily wetted by solder, by surface tension.

As a result, the electrical connection between the electrodes 132a and 133a is cut off and an accident due to an extraordinary overheating of the electric circuit can be prevented from occurring.

When the above conventional thermal fuse 130 is formed, the solder 135 must be put on the gap 134 between the electrodes 132a and 133a on such a condition that the solder 135 is nearly completely melted. However, at this time, the solder 135 splits into two parts toward each electrode 132a and 133a, that is, it is very hard to put the solder 135 that is nearly completely melted on the gap 134 between the electrodes 132a and 133a.

Therefore, there has been a problem that the thermal fuse 130 can not be easily formed by soldering simultaneously with soldering of other electric components by employing an automatic soldering machine and the like.

As shown in FIG. 15A, the gap 134 between the electrodes 132a and 133a extends in a direction along an arrow shown in the figure, in another word, there is no electrode that can stop the molten solder 135 along the direction, therefore, the molten solder 135 can not stay steadily on the surface of the circuit board at the gap 134, causing the above problem.

However, the nature that the molten solder 135 easily splits into two parts toward each electrode 132a and 133a essentially contributes to reliability of the thermal fuse upon the extraordinary overheating of the electric circuit, it is required that the molten solder 135 should not split into two parts toward each electrode 132a and 133a only when the thermal fuse 130 is formed.

In order to solve the above problem, Japanese Patent Application Laid-Open No. H4-56028 has proposed a thermal fuse, in which an electrode of one conductor pattern and an electrode of another conductor pattern, which are separated and insulated from each other on a circuit board, are connected by using porous solder layer in which openings among the solder grain remain.

According to the above idea, however, in order to form the porous solder layer, particular steps including printing solder cream on a circuit board and half-melting the solder cream are required, causing a problem that the thermal fuse can not be easily formed by soldering simultaneously with soldering of other electric components by employing an automatic soldering machine and the like.

SUMMARY OF THE INVENTION

It is therefore an objective of the present invention to solve the above problems and to provide a safety device of an electric circuit and a process for producing the same, the safety device containing first and second protective devices, wherein an accident is securely prevented from occurring by using the second protective device such as a thermal fuse even when the first protective device such as an overcurrent protective element is extraordinarily overheated, further, the thermal fuse can quickly operate when the overcurrent protector is extraordinarily overheated, and furthermore, the thermal fuse can be easily formed by employing an automatic soldering machine and the like.

In order to attain the above objective, the present invention is to provide a safety device of an electric circuit comprising: first protective means in an overcurrent protector for protecting the electric circuit from an overcurrent, which generates heat to increase its electrical resistance when an overcurrent flows in the electric circuit, whereby reducing or cutting off the overcurrent; and second protective means including a thermal fuse situated in the vicinity of the overcurrent protector comprising: a first electrode having a first conductor pattern connected to the overcurrent protector; a second electrode having a second conductor pattern insulated from the first electrode by a gap; and solder connecting the first and second electrodes and melting by heat from the overcurrent protector so as to split into two parts toward the first and second electrodes.

With the construction mentioned above, when the overcurrent protector is extraordinarily overheated due to the overcurrent, the thermal fuse operates responding to the heat and the electric circuit is cut off.

Therefore, an accident due to the extraordinary overheating of the overcurrent protector, such as a vehicle fire and the like, can be securely prevented.

Resist films around the thermal fuse can be peeled off by the heat from the overcurrent protector.

With the construction mentioned above, when the solder for forming the thermal fuse melts, the molten solder is sucked into a space between the peeled resist films and a surface of the circuit board, thereby an electrical connection between the first and second conductor patterns are cut off more quickly.

Therefore, the thermal fuse can quickly operate when the overcurrent protector is extraordinarily overheated, thereby an accident can be more securely prevented from occurring.

The thermal fuse is disposed at substantially the level of the overcurrent protector or a higher level than that of the overcurrent protector when a circuit board, on which the overcurrent protector and the thermal fuse are mounted, is set vertically.

With the construction mentioned above, thermal conduction from the overcurrent protector to the thermal fuse becomes good due to a positional relationship therebetween.

When the thermal fuse is situated nearly at a level of the overcurrent protector, the heat of the overcurrent protector is directly conducted to the thermal fuse. When the thermal fuse is situated at a higher level than that of the overcurrent protector, the heat of the overcurrent protector situated at a lower level can be efficiently conducted to the thermal fuse situated at a higher level.

In addition, since the circuit board is set vertically, the solder melted due to the heat of the overcurrent protector naturally can flow downward.

Therefore, when the overcurrent protector is extraordinarily overheated, an electrical connection between the. first and second conductor patterns are cut off more quickly, that is, the thermal fuse can quickly operate so as to prevent an accident from occurring more securely.

The gap between the first and second electrodes for forming the thermal fuse is provided with a hole, a lead of an electric component is inserted in the hole, and the first and second electrodes together with the lead are connected by solder.

With the construction mentioned above, since the solder for connecting the first and second electrodes adheres to the lead of an electric component, the solder is easily set between the first and second electrodes, therefore, the thermal fuse can be easily formed by soldering using ordinary solder simultaneously with soldering of the other electric components by employing an automatic soldering machine and the like.

Furthermore, since no additional separated thermal fuse is needed to be formed, a number of points for soldering on the ciucuit board becomes less, thereby improving workability and reliability.

The electric component is the overcurrent protector.

With the construction mentioned above, the heat of the overcurrent protector is conducted to the thermal fuse through the lead of the overcurrent protector, therefore, the thermal fuse can more quickly operate when the overcurrent protector is extraordinarily overheated.

The second conductor pattern for forming the thermal fuse is formed on one side of the circuit board and connected to the second electrode having an island shape formed on an opposite side of the circuit board through a through-hole, the first electrode continuously surrounds the second electrode with a gap between the first and second electrodes on the opposite side of the circuit board, and solder connects the first and second electrodes.

With the construction mentioned above, since nearly completely molten solder situated inside of the continuous first electrode can be stopped by the first electrode, the molten solder can stay stably on the gap between the first and second electrodes.

Consequently, soldering using ordinary solder simultaneously with soldering of the other electric components by employing an automatic soldering machine and the like can easily form the thermal fuse.

Further, when the overcurrent protector is extraordinarily overheated, the nearly completely molten solder splits into two parts toward the first and second electrodes, then an electrical connection between the first and second conductor patterns is cut off, thereby reliability of the thermal fuse is improved.

The second electrode for forming the thermal fuse is formed to have an island shape at the periphery of a hole for inserting a lead of an electric component therein, the first electrode continuously surrounds the second electrode with a gap between the first and second electrodes, and solder connects the first electrode, the second electrode and the lead of the electric component inserted in the hole.

With the construction mentioned above, the solder connecting the first and second electrodes adheres to the lead of the electric component, so that the solder can be much more easily put on the gap between the first and second electrodes.

Further, the thermal fuse can be formed only on one side of the circuit board, thereby simplification of the circuit board is attained.

The first electrode for forming the thermal fuse is formed to have an island shape at the periphery of a hole for inserting a lead of the overcurrent protector therein, the second electrode continuously surrounds the first electrode with a gap between the first and second electrodes, and solder connects the first electrode, the second electrode and the lead of the overcurrent protector inserted in the hole.

With the construction mentioned above, the heat of the overcurrent protector is conducted to the thermal fuse through the lead of the overcurrent protector, therefore, the thermal fuse can much more quickly operate when the overcurrent protector is extraordinarily overheated.

The overcurrent protector is a positive temperature coefficient element.

A PTC element, specifically a low resistance-type PTC element is a suitable overcurrent protector for an electric circuit of a power unit and the like mounted on an electric vehicle. By employing the PTC element as an overcurrent protector that constructs the safety device of an electric cuicuit, the safety device becomes specifically suitable for use in an electric vehicle.

Further, the present invention is to provide a preocess for producing the safety device of an electric circuit, characterized in that soldering for connecting the first and second electrodes to form the thermal fuse is performed simultaneously with soldering of electric components including the overcurrent protector on the circuit board by employing an automatic soldering machine.

According to the process mentioned above, the thermal fuse can be easily formed by soldering using ordinary solder, which is used for connecting other electric components to a circuit board, simultaneously with soldering of the other electric components by employing an automatic soldering machine and the like, thereby enabling a production of the safety device of an electric circuit at a low cost without employing a conventional specific production step.

A through-hole of a circuit board is filled with solder, the solder has a concave shape at one opening of the through-hole and a convex shape at an opposite opening of the through-hole, and the convex-shape solder connects the first and second electrodes.

With the construction mentioned above, when the solder melts due to an extraordinarily high temperature, solder at the convex shape portion moves into the through-hole (that is, toward the concave shape portion), thereby an electrical connection between the first and second electrodes is cut off quickly and securely.

An inner diameter of the through-hole is larger than a thickness of the circuit board.

With the construction mentioned above, the solder at the convex shape portion can move more quickly into the through-hole, thereby the interruption of the circuit is attained more quickly. Further, in a process for producing the safety device, the concave shape portion and convex shape portion are formed easily and securely due to the solder's own weight.

An outer diameter of an exposed conductor on the circuit board at the concave-shape solder side is larger than an outer diameter of the second electrode at least near to the through-hole.

With the construction mentioned above, when the molten solder melted due to an extraordinarily high temperature moves toward the concave shape portion, the molten solder is sucked by an exposed conductor having good wettability and therefore moved quickly, thereby the interruption of the circuit is attained quickly and more securely.

The circuit board is arranged vertically or arranged so as to set the convex-shape solder up.

By arranging the circuit board vertically, the molten solder melted due to an extraordinarily high temperature is securely sucked into the through-hole. By arranging the circuit board so as to set the convex shape portion up, the solder at the convex shape portion quickly moves toward the concave shape portion due to the solder's own weight, thereby the interruption of the circuit is attained quickly and more securely.

Furthermore, the present invention is to provide a preocess for producing the safety device of an electric circuit, characterized in that the circuit board is arranged horizontally and the through-hole extending vertically is filled with molten solder, whereby the concave shape and the convex shape are formed at respecitve sides with its own weight.

According to the process mentioned above, the concave shape portion and convex shape portion of the solder are easily formed due to the solder's own weight, resulting in a low cost of producing the thermal fuse.

BRIEF DESCRIPTION OF THE DRAWINGS

FIG. 1 is a cross sectional view illustrating a safety device of an electric circuit according to a first preferred embodiment of the present invention;

FIGS. 2A and 2B are a front view and a rear view, respectively, illustrating a safety device of an electric circuit according to the first preferred embodiment of the present invention;

FIGS. 4A and 4B are a front view and a rear view, respectively, illustrating only a circuit board constructing a safety device of an electric circuit according to the first preferred embodiment of the present invention;

FIGS. 5A, 5B and 5C are front views illustrating behavior of a thermal fuse constructing a safety device of an electric circuit according to the first preferred embodiment of the present invention;

FIG. 7 is a schematic representation illustrating a conductor pattern of a thermal fuse in a safety device of an electric circuit according to the second preferred embodiment of the present invention;

FIG. 8 is a cross sectional view illustrating a safety device of an electric circuit according to a third preferred embodiment of the present invention;

FIG. 9 is a cross sectional view illustrating a safety device of an electric circuit according to a fourth preferred embodiment of the present invention;

FIG. 10 is a cross sectional view illustrating behavior of a thermal fuse constructing a safety device of an electric circuit according to the fourth preferred embodiment of the present invention;

FIG. 13 is a schematic appearance of a safety device of an electric circuit employing a conventional positive temperature coefficient (PTC) element;

DESCRIPTION OF THE PREFERRED EMBODIMENTS

In the following, the preferred embodiments of a safety device of an electric circuit and a process for producing the same according to the present invention are explained with reference to the attached drawings.

FIG. 1 is a cross sectional view illustrating a safety device of an electric circuit according to a first preferred embodiment of the present invention.

FIGS. 2A and 2B are a front view and a rear view, respectively, illustrating the safety device of an electric circuit.

Figure 3:
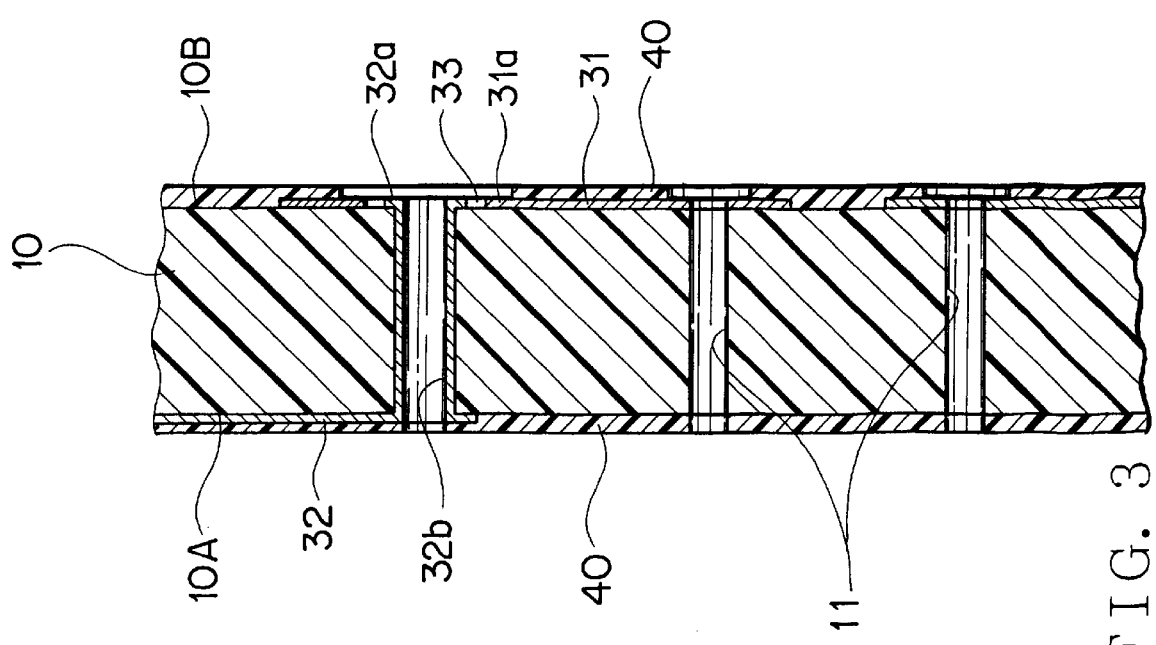
FIG. 3 is a cross sectional view illustrating only a circuit board constructing a safety device of an electric circuit according to the first preferred embodiment of the present invention.

FIG. 3 is a cross sectional view illustrating only a circuit board constructing the safety device of an electric circuit.

FIGS. 4A and 4B are a front view and a rear view, respectively, illustrating only a circuit board constructing the safety device of an electric circuit.

FIGS. 5A, 5B and 5C are front views illustrating behavior of a thermal fuse constructing the safety device of an electric circuit.

As shown in FIGS. 1, 2A and 2B, a safety device 1 of an electric circuit according to the first preferred embodiment consists of a PTC element (overcurrent protector) 20 mounted in the vicinity of a circuit board 10 and a thermal fuse 30.

The PTC element 20 is first protective means for protecting the electric circuit from an overcurrent, which generates heat to increase an electrical resistance thereof when an overcurrent flows in the electric circuit, whereby reducing or breaking the overcurrent.

A pair of leads 21 of the PTC element 20 is inserted in holes 11 formed through the circuit board 10, then a pair of the leads 21 is soldered to electrodes of two conductor patterns (one of which is a first conductor pattern 31 explained in the following) formed on a back side (an opposite side) 10B of the circuit board 10.

The thermal fuse 30 is second protective means situated in the vicinity of the PTC element 20, being constructed in such a manner that solder 34 connects a first electrode 31a of the first conductor pattern 31 connected to the PTC element 20 and a second electrode 32a of a second conductor pattern 32 insulated from the first electrode 31a by a gap 33.

As shown in FIGS. 1, 2A and 2B and corresponding FIGS. 3, 4A and 4B, the first conductor pattern 31 is formed on the back side (the opposite side) 10B of the circuit board 10, while a corresponding second conductor pattern 32 is formed on a right side (one side) 10A of the circuit board 10.

The second conductor pattern 32 is connected to the second electrode 32a having an island shape formed on the backside 10B of the circuit board 10 through a long through-hole 32b.

As shown in FIGS. 4B and 5A, the first electrode 31a of the first conductor pattern 31 continuously surrounds the second electrode 32a with the gap 33 between the first electrode 31a and second electrode 32a.

As shown in FIGS. 1, 2B and 5B, the solder 34 connects the first electrode 31a and second electrode 32a, thereby the thermal fuse 30 is formed.

As shown in FIG. 1, both sides 10A and 10B of the circuit board 10 are covered with resist films 40 except portions of all electrodes including the first electrode 31a and the second electrode 32a. Therefore, the first electrode 31a and the second electrode 32a are portions onto which the solder 34 can adhere, since there is no resist film 40 on said portions. In the first preferred embodiment, when the PTC element 20 is extraordinarily overheated, the resist films 40 around the thermal fuse 30 are peeled off due to heat from the PTC element 20.

In order to allow the resist films 40 around the thermal fuse 30 are peeled off due to the heat, the PTC element 20 and the thermal fuse 30 should be situated close enough with each other so that the heat of the PTC element 20 upon its extraordinary overheating can be conducted to the thermal fuse 30.

In addition, the resist films 40 should have such strength that the resist films 40 can be peeled off due to the heat from the PTC element 20 (normaly, about 1000° C.) upon its extraordinary overheating.

An experiment revealed that an ordinary resist film (peel strength being ½ with respect to heat corresponding to temperature of 300° C. or higher) that has been employed in an ordinary circuit board can be sufficiently well peeled off.

Furthermore in the first preferred embodiment, as shown in FIG. 1, in a state that the circuit board 10 is set vertically, the circuit is designed in such a manner that a level of the thermal fuse 30 is higher than that of the PTC element 20.

In the following, a process for producing the safety device of an electric circuit according to the first embodiment is explained. The safety device 1 of an electric circuit is formed simultaneously with soldering of other electric components (not shown in the figure) on the citcuit board 10 by using an automatic soldering machine (not shown in the figure).

That is, after all the electric components including the PTC element 20 are mounted on the circuit boade 10, soldering of the electric components and formation of the thermal fuse 30 (connection between the first and second electrodes, 31a and 32a, respectively, by the solder 34) are simultaneously carried out by using, for example, a jet-type automatic soldering machine.

In the following, an operation of the safety device 1 of an electric circuit according to the first embodiment is explained with reference to FIGS. 1, 5B and 5C.

In FIG. 1, when an electric current flows in the electric circuit, the PTC element is overheated and increases its resistance, thereby the overcurrent is decreased or cut off and security of the electric circuit is maintained.

However, when the overcurrent still keeps to flow and the PTC element 20 is extraordinarily overheated, heat is conducted from the PTC element to the thermal fuse 30 through the lead 21 and the first conductor pattern 31.

At this time, the heat is efficiently conducted from the PTC element 20 situated at a low level of the vertically set circuit board 10 to the thermal fuse 30 situated at a higher level than that of the PTC element 20.

When the heat from the PTC element 20 is conducted to the thermal fuse 30, the solder 34 connecting the first electrode 31a and the second electrode 32a melts completely and the resist films 40 around the thermal fuse 30 are peeled off due to the heat (see FIG. 5B).

Specifically, the resist film 40 situated below the thermal fuse 30 and in the vicinity of the PTC element that is a heat source are peeled off markedly.

Then, as shown in FIG. 5C, a part of (sometimes, whole of) the molten solder 34 is sucked into an opening formed between the peeled resist film 40 and a surface of the circuit board and at the same time, the rest of the solder 34 is repeled by an surface of the circuit board, which is hard to be wetted by solder, at the gap 33.

Since the circuit board is set vertically, the molten solder 34a positively flows downward into the opening formed between the peeled resist film 40 and a surface of the circuit board due to the solder's own weight.

As a result, the solder connecting the first electrode 31a and the second electrode 32a splits into two parts toward the first and second electrodes 31a and 32a, respectively, which are easily wetted by solder, thereby an electrical connection between the first conductor pattern 31 and the second conductor pattern 32 is cut off.

The safety device of an electric circuit according to the first preferred embodiment shows an excellent effect as follows.

First, even when the PTC element 20 that is an overcurrent protector is extraordinarily overheated due to an overcurrent, the thermal fuse 30 acts by heat generated at the PTC element 20, thereby the electric circuit is cut off.

Therefore, an accident such as a vehicle fire due to the extraordinary overheating of the PTC element 20 can be securely prevented.

Second, since the PTC element 20 and the thermal fuse 30 are arranged closely with each other so that the resist films 40 around the thermal fuse 30 are peeled off upon the extraordinary overheating of the PTC element 20, a part or a whole of the molten solder 34 is sucked into an opening formed between the peeled resist film 40 and a surface of the circuit board, thereby an electrical connection between the first conductor pattern 31 and the second conductor pattern 32 can be quickly cut off.

Therefore, the thermal fuse 30 can quickly act upon the extraordinary overheating of the PTC element 20, thereby preventing an accident more securely.

Third, since the circuit board 10 is set vertically and the thermal fuse 30 is situated at a level higher than that of the PTC element 20, heat is conducted very well from the PTC element 20 that is a heat source to the thermal fuse 30 and further, when the solder 34 that forms the thermal fuse 30 is melted, the solder 34 positively flows downward due to the solder's own weight and the resist films 40 are markedly peeled off due to the heat, thereby an electrical connection between the first conductor pattern 31 and the second conductor pattern 32 can be more quickly cut off.

Therefore, the thermal fuse 30 can more quickly act upon the extraordinary overheating of the PTC element 20, thereby preventing an accident much more securely.

Fourth, since the first electrode 31a that forms the thermal fuse 30 continuously surrounds the second electrode 32a with the gap 33 between the first and second electrodes, the nearly completely molten solder 34 situated inside of the continuous first electrode 31a can be stopped by the first electrode 31a, the nearly completely molten solder 34 can stay stably on the gap 33 between the first and second electrodes, 31a and 32a, respectively.

Consequently, soldering using ordinary solder 34 simultaneously with soldering of the other electric components by employing an automatic soldering machine and the like can easily form the thermal fuse 30.

Further, when the PTC element 20 is extraordinarily overheated, the completely molten solder 34 splits into two parts toward the first and second electrodes 31a and 32a, respectively, then an electrical connection between the first and second conductor patterns 31 and 32, respectively are cut off, improving reliability of the thermal fuse 30.

Furthermore, by the process for producing the safety device of an electric circuit according to the first preferred embodiment, the thermal fuse 30 can be easily formed by soldering using ordinary solder 34, which is used for connecting other electric components to a circuit board, simultaneously with soldering of the other electric components by employing an automatic soldering machine and the like, thereby enabling a production of the safety device of an electric circuit at a low cost without employing a conventional specific production step.

In the following, a second preferred embodiment of a safety device of an electric circuit according to the present invention is explained.

Figure 6:
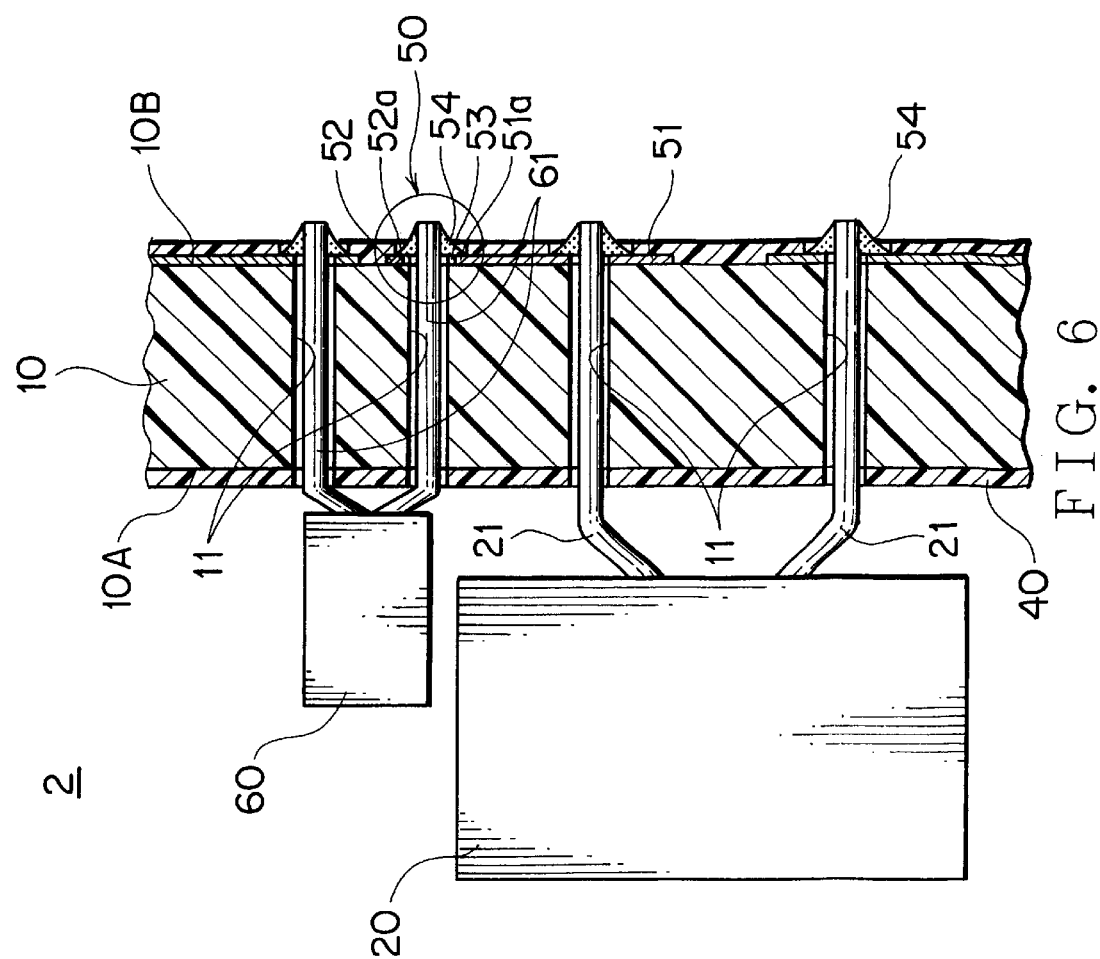
FIG. 6 is a cross sectional view illustrating a safety device of an electric circuit according to a second preferred embodiment of the present invention.

FIG. 6 is a cross sectional view illustrating a safety device of an electric circuit according to the second preferred embodiment of the present invention.

FIG. 7 is a schematic representation illustrating a conductor pattern of a thermal fuse in the above safety device of an electric circuit.

In a safety device 2 of an electric circuit shown FIGS. 6 and 7, an first electrode 51a of a first conductor pattern 51 connected to the PTC element 20 and a second electrode 52a of a second conductor pattern 52 insulated from the first electrode 51a by a gap 53 are formed on the back 10B of the circuit board 10.

The gap 53 between the first and second electrodes 51a and 52a, respectively, is provided with a hole 11, a lead 61 of an electric component 60 is inserted in the hole 11, and the first and second electrodes 51a and 52a, respectively, together with the lead 61 are connected by solder 54 to form the thermal fuse 50.

With the construction mentioned above, since the solder 54 for connecting the first and second electrodes 51a and 52a, respectively, adheres to the lead 61 of the electric component 60, the solder 54 is easily set between the first and second electrodes.

Therefore, the thermal fuse 50 can be easily formed by soldering using ordinary solder 54 simultaneously with soldering of the electric component 60 by employing an automatic soldering machine and the like.

Further, since no additional separated thermal fuse (for example, the thermal fuse 30 in the first preferred embodiment) is needed to be formed, a number of points for soldering on the ciucuit board 10 becomes less, thereby improving workability and reliability.

Furthermore, in comparison with the thermal fuse 30 (see FIG. 1) in the safety device 1 of an electric circuit according to the first preferred embodiment, which uses both side 10A and 10B of the circuit board 10, in the safety device 2 of an electric circuit according to the second preferred embodiment, the thermal fuse 50 can be formed only on one side 10B of the circuit board 10, thereby simplification of the circuit board 10 is attained.

In the following, a third preferred embodiment of a safety device of an electric circuit according to the present invention is explained.

FIG. 8 is a cross sectional view illustrating a safety device of an electric circuit according to the third preferred embodiment of the present invention.

A safety device 3 of an electric circuit according to the third preferred embodiment shown FIG. 8 is a safety device further improved on the basis of the safety device 1 (see FIG. 1) of the first preferred embodiment and the safety device 2 of the second preferred embodiment.

In short, the safety device 3 is characterized in that a thermal fuse 70 having a similar construction to that of the thermal fuse 30 according to the first preferred embodiment is formed around the hole 11 for inserting the lead 21 of the PTC element 20 therein.

An island-shaped first electrode 71a (that is, a first conductor pattern 71) to be connected to the lead 21 of the PTC element 20 is formed at the periphery of the hole 11 on the back 10B of the circuit board 10.

Then, the second electrode 72a of the second conductor pattern 72 surrounds the island-shaped first electrode 71a with a gap 73 between the first electrode 71a and the second electrode 72a.

An external appearance of the first electrode 71a, the second electrode 72a and the hole 11 is the same as the external appearance shown in FIG. 5A of the first preferred embodiment.

Solder 74 connects the first electrode 71a, the second electrode 72a and the lead 21 of the PTC element 20 inserted in the hole 11, thereby the fuse 70 is formed.

With the construction mentioned above, the heat of the PTC element 20 is conducted to the thermal fuse 70 through the lead 21 of the PTC element 20, therefore, in comparison with the fuse 30 and 50 of the safety device 1 and 2 according to the first and second preferred embodiment, respectively, the thermal fuse 70 can more quickly operate when the PTC element 20 is extraordinarily overheated.

Further, since the solder 74 connecting the first and second electrodes 71a and 72a, respectively, adheres to the lead 21 of the PTC element 20, in comparison with the fuse 30 and 50 of the safety device 1 and 2 according to the first and second preferred embodiment, respectively, the solder 74 can be much more easily put on the gap 73 between the first and second electrodes 71a and 72a, respectively.

Furthermore, similarly to the safety device 2 of the second preferred embodiment, a number of points for soldering on the ciucuit board 10 becomes less, thereby improving workability and reliability. In addition, the thermal fuse 70 can be formed only on one side 10B of the circuit board 10, thereby simplification of the circuit board 10 is attained.

The safety device of an electric circuit according to the present invention is not limited to each preferred embodiment mentioned above.

The overcurrent protector that is the first protective means for protecting the electric circuit from an overcurrent is not limited to the PTC element 20 mentioned above. The overcurrent protector may be an element that generates heat to increase its electrical resistance when an overcurrent flows in the electric circuit and that decreases or shuts off the overcurrent, such as a varistor and an aluminum electrolytic capacitor. Further, the thermal fuse 50 (see FIG. 6) in the safety device 2 of the second preferred embodiment can be replaced by the thermal fuse 70 (see FIG. 8) in the safety device 3 of the third preferred embodiment and the other way around.

In the following, a fourth preferred embodiment of a safety device of an electric circuit according to the present invention is explained.

FIG. 9 is a cross sectional view illustrating a safety device of an electric circuit according to the fourth preferred embodiment of the present invention.

FIG. 10 is a cross sectional view illustrating behavior of a thermal fuse constructing the above safety device of an electric circuit.

In FIGS. 9 and 10, components such as the PTC element 20 (see FIG. 1) and the electric component 60 (see FIG. 6) illustrated in the figures in the preceding preferred embodiment are not shown.

As shown in FIG. 9, in a safety device 4 of an electric circuit, the through-hole 81 formed in the circuit board 80 is filled with solder 82, a concave shape portion 83 of the solder 82 is formed at one opening 81a of the through-hole 81, a convex shape portion 84 of the solder 82 is formed at an opposite opening 81b of the through-hole 81, wherein, upon melting of the solder 82 as shown in FIG. 10, the convex shape portion 84 moves toward the concave shape portion 83 and flows into the through-hole 81, that is, the convex shape portion 84 draws back, thereby the thermal fuse 88 disconnects a soldered connection between a first electrode 85 and a second electrode 86 on a circuit board 80.

In FIG. 9, the circuit board 80 is situated horizontally so as to set one side 80A up, on which electric components such as the PTC element 20 (see FIG. 1) and the electric component 60 (see FIG. 6) are mounted. The through-hole 81 is situated vertically and the solder 82 in the through-hole 81 forms the convex shape portion 84 at a lower side and the concave shape portion 83 at an upper side due to gravity upon melting. The convex shape portion 84 has a curved surface 84a having a large diameter, while the concave shape portion 83 has a curved surface 83a having a small diameter. Each curved surface 83a or 84a is spherical and generated by surface tension of the molten solder 82. A wettability of the solder 82 is good in the through-hole 81 due to a conductor 89 formed on an inner circumference of the through-hole 81, therefore the solder 82 can move easily.

The conductor 89 in the through-hole 81 is connected to the second electrode 86 situated on an opening periphery of the through-hole 81 at an opposite side 80B of the circuit board 80. The first electrode 85 is formed at the outside of the second electrode 86 setting a narrow gap 87 therebetween. The first electrode 85 is connected to a first conductor pattern 90, while the second electrode 86 is connected to a second conductor pattern 91 through a short exposed conductor 96 on the side 80A. The electrodes 85 and 86 and the gap 87 each has a ring shape similarly to a corresponding element shown in FIG. 5A.

At the side 80A of the circuit board 80, a resist film 92 is formed on the second conductor pattern 91, while at the side 80B, a resist film 93 is formed on the first conductor pattern 90. The resist film 92 at the side 80A is extended to a very vicinity of one opening 81a of the through-hole 81, while the resist film 93 at the side 80B is situated at the outside of the gap 87 a little away from an opposite opening 81b of the through-hole 81. That is, an end 93a of the resist film 93 at the side 80B is situated farther from the through-hole 81 radially than an end 92a of the resist film 92 at the side 80A.

Consequently, the convex shape portion 84 having a large diameter situated at a lower side of the solder 82 extends up to the end 93a of the resist film 93 striding over the gap 87. The solder 82 hardly enter into the narrow gap 87 due to its surface tension. Even if the solder 82 enters into the gap 87, since a surface of an insulating circuit board body 95 has a low wettability with respect to the solder 82, the molten solder 82 easily leave from the gap 87. The solder 82 strides over the gap 87 so as to connect with the first and second electrodes 85 and 86, respectively, thereby the thermal fuse 88 is formed. A top end of the concave shape portion 83 on the upper side of the solder 82 is situated at an opening end of the through-hole 81 and does not protrude beyond a level of the one opening 81a.

The through-hole 81 is filled with the solder 82 by using, for example, a jet-type-soldering machine. That is, the molten solder 82 is thrown up like a fountain in a furnace, then the circuit board 80 is transferred therein to contact a surface of the circuit board 80 to the molten solder 82, thereby the solder 82 adheres to each metallic conductor of the circuit board 80. At this time, the solder 82 is sucked up into the through-hole 81 due to a wettability of the conductor 89 in the through-hole 81, thereby through-hole 81 is filled with the solder 82. In this jet-type-soldering step, electric components such as the PTC element 20 (see FIG. 1) are simultaneously soldered on the circuit board 80.

In the jet-type soldering step, when an inner diameter $D_1$, of the through-hole 81 is less than a board thickness $T_1$, of the circuit board 80, the concave shape portion 83 shown in FIG. 9 can not be formed due to a surface tension of the solder entered in the through-hole, instead, a convex shape portion like an expanded part 97 shown in FIG. 10 is formed. Therefore, the inner diameter of the through-hole 81 (in the strict sense of the word, an inner diameter of the conductor 89 in the through hole) $D_1$, is set larger than the board thickness $T_1$, of the circuit board 80 (in the strict sense of the word, a board thickness including a thickness of the resist film). In a step for forming the thermal fuse 88 as shown in FIG. 9, this is a necessary condition so that the concave shape portion 83 is formed at an upper side due to the solder's own weight and that the convex shape portion 84 is formed sufficiently large at an lower side by overcoming the surface tension of the molten solder 82. When the inner diameter $D_1$, of the through-hole 81 is less than the board thickness $T_1$ of the circuit board 80, the concave shape portion 83 at the upper side and the convex shape portion 84 at the lower side are hardly formed due to the surface tension of the molten solder 82. Further, in this state, the conductor patterns 90 and 91 are hardly disconnected even when the solder 82 is melted by a generated heat due to an extraordinary overheating. By setting the inner diameter $D_1$, of the through-hole 81 larger than the board thickness $T_1$, of the circuit board 80, in FIG. 10, the solder 82 melted due to an extraordinarily high temperature is easily sucked into the through-hole 81, thereby a rate of interruption of an electric circuit becomes higher.

The thermal fuse 88 is formed in a state that the circuit board 80 is set horizontally as shown in FIG. 9 and used in a state that the circuit board 80 is set vertically as shown in FIG. 10. FIG. 10 illustrates that the solder 82 is melted due to an extraordinary overheating of the PTC element 20 (see FIG. 1) and the electrodes 85 and 86 of the conductor patterns 90 and 91, respectively, are electrically disconnected.

That is, the solder 82 having the concave shape portion 83 and the convex shape portion 84 as shown in FIG. 9 melts, then the solder 82 at the projecion 84 flows into the concave shape portion 83 and a curvature of the convex shape portion 84 becomes less as shown in FIG. 10 and then, an edge 84b of the convex shape portion 84 is parted from the first electrode 85 inwardly, passed through the gap 87 and transferred to the second electrode side. As a result, the solder 82 splits into two parts toward the first and second electrodes, an electrical connection between the two electrodes is cut off, and the first and second conductor patterns 90 and 91, respectively, are interrupted by the gap 87. An inflow of the solder 82 at the convex shape portion 84 into the concave shape portion 83 makes the concave shape portion 83 rather bulge. An end 97a of this bulged part 97 abuts on an end of the resist film 92 to stop there.

A state for using the thermal fuse 88 is not limited to the state, in which the circuit board 80 is set vertically as shown in FIG. 10. For example, the circuit board 80 is set upside down so that the concave shape portion 83 of the solder 82 is situated at a lower side and that the convex shape portion 84 is situated at an upper side.

In the above state, since the through-hole 81 is set vertically, the molten solder 82 easily flow into the concave shape portion 83 due to its own weight, compared to the state shown in FIG. 10, and a disconnection of an electric circuit is carried out more quickly and securely. The gap 87 between both electrodes is situated at the convex shape portion 84 side (upper side). Further, it is possible to use the circuit containing the safety device in such a state that the circuit board 80 is tilted. In this case, the convex shape portion 84 of the solder 82 and the gap 87 between both electrodes are situated at an upper side of the circuit board 80.

In the following, a fifth preferred embodiment of a safety device of an electric circuit according to the present invention is explained.

Figure 11:
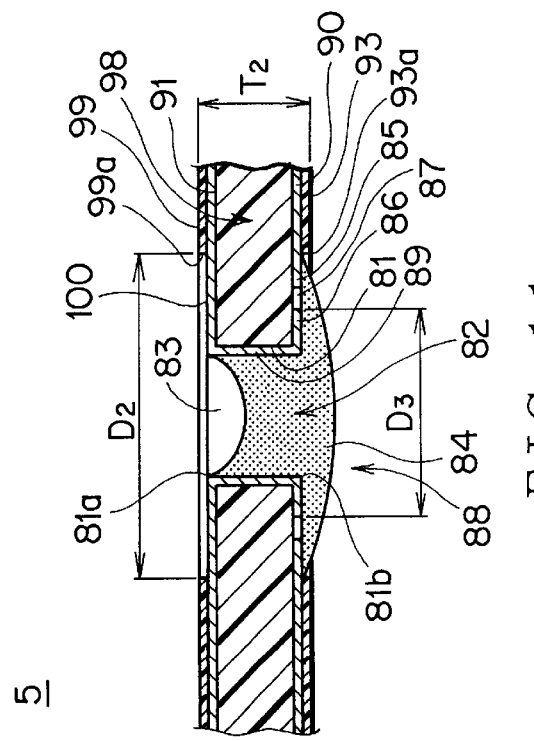
FIG. 11 is a cross sectional view illustrating a safety device of an electric circuit according to a fifth preferred embodiment of the present invention.
Figure 12:
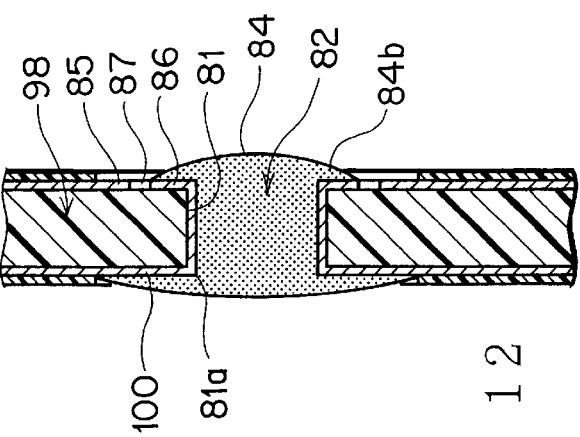
FIG. 12 is a cross sectional view illustrating behavior of a thermal fuse constructing a safety device of an electric circuit according to the fifth preferred embodiment of the present invention.
Figure 14A:
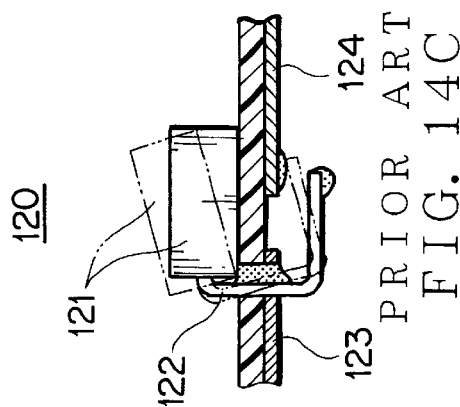
FIGS. 14A, 14B and 14C are schematic representations illustrating a construction and behavior of a safety device of an electric circuit employing a conventional voltage-dependent type varistor (ZNR)
Figure 14B:
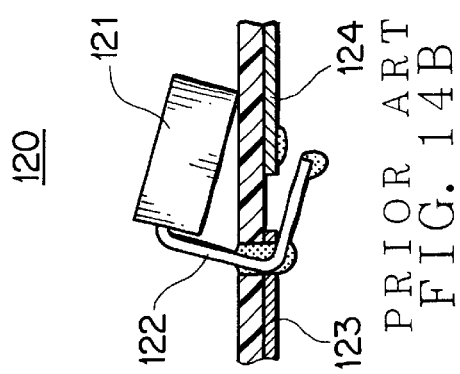
Figure 14C:
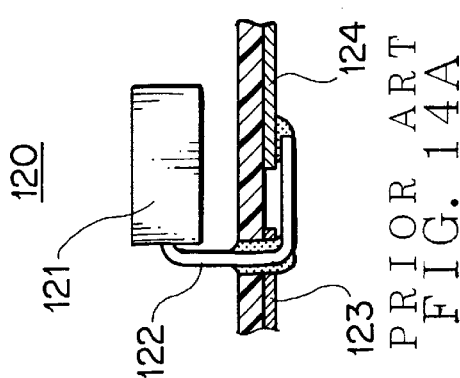
Figure 15A:
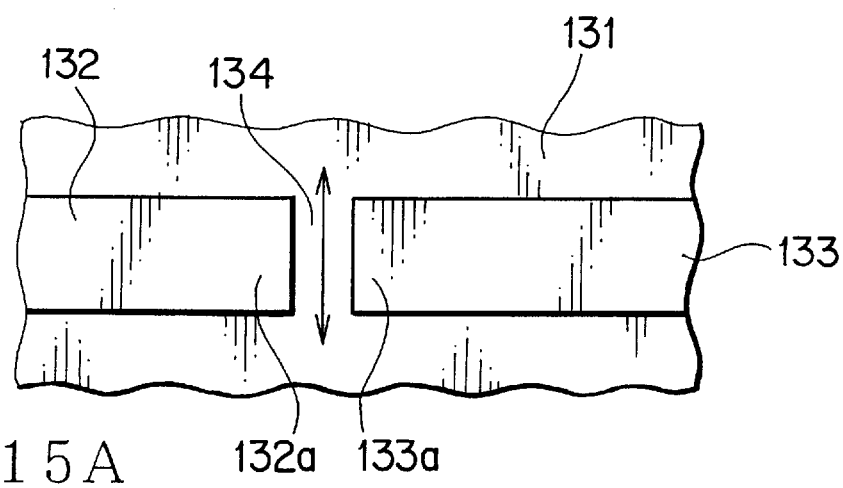
FIGS. 15A, 15B and 15C are schematic representations illustrating a construction and behavior of a conventional thermal fuse.
Figure 15B:
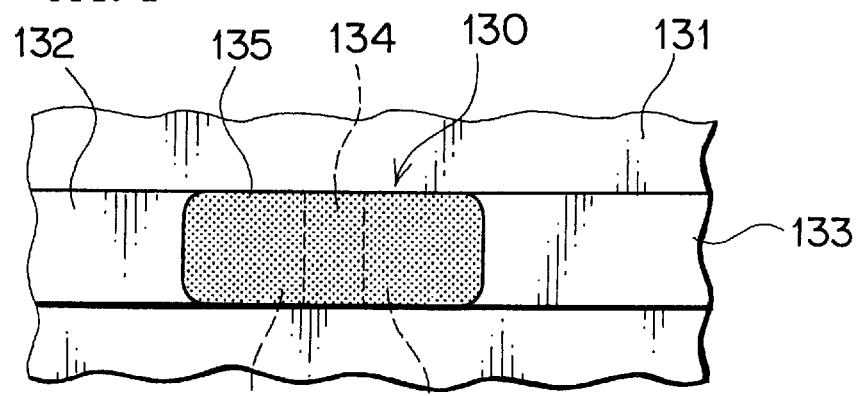
Figure 15C:
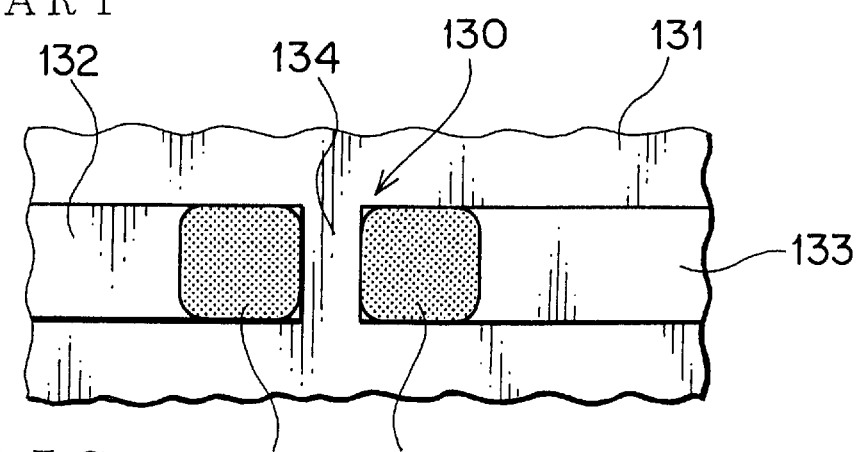

FIG. 11 is a cross sectional view illustrating a safety device of an electric circuit according to the fifth preferred embodiment of the present invention;

FIG. 12 is a cross sectional view illustrating behavior of a thermal fuse constructing the above safety device of an electric circuit.

The same abbreviation numerals are used for the same elements as the fourth preferred embodiment and their detailed explanation is omitted.

A safety device 5 according to the fifth preferred embodiment is similar with the safety device 4 of the fourth preferred embodiment in points that the concave shape portion 83 is formed at an upper side of the solder 82 and that the convex shape portion 84 is formed at a lower side so as to form the thermal fuse 88 when a circuit board 98 is set horizontally. The safety device 5 differs from the safety device 4 in points that a resist film 99 at the concave shape portion 83 side on the circuit board 98 is largely reduced so as to increase a distance $D_2$ between both ends 99a of the resist film 99, that is, to largely expose a conductor 100 on one side of the circuit board on which electric components are mounted, thereby an outer diameter $D_2$ of an island-shape exposed conductor 100 is set large. The other construction of the safety device 5 is similar to that of the safety device 4.

In FIG. 11, a resist film 93 on an oppsite side of the circuit board 98 is away from the through-hole 81 similarly to the safety device 4 and decreased a little in a radial direction of the through-hole 81 compared to the end 99a of the resist film 99. Each of first electrode 85, the gap 87 and the second electrode 86 is situated like a ring on a portion having no resist film 93. The outer diameter $D_2$ of the exposed conductor 100 is set larger than an outer diameter $D_3$ of the island-shape second electrode 86 connected to the conductor 89 in the through-hole 81.

The concave shape portion 83 of the solder 82 is situated in an upper opening 81a of the through-hole 81, while the convex shape portion 84 protrudes largely from an lower opening 81b and situates abutting on an end 93a of the resist film 93. An inner diameter of the through-hole 81 is larger than a board thickness $T_2$ of the circuit board 98 similarly to the safety device 4.

In a state that the circuit board 98 is set vertically as shown in FIG. 12, when the solder 82 is melted due to an extraordinary high temperature, the convex shape portion 84 of the solder 82 is transferred to the concave shape portion 83 side (in FIG. 11) and sucked by the exposed conductor 100, thereby the solder 82 positively expands toward the opening 81a of the through-hole 81. This is because the exposed conductor 100 has a good wettability with respect to the solder 82.

In the safety device 5, an outflow of the solder 82 to the one side of the circuit board on which electric components are mounted is increased and a disconnection between the electrodes 85 and 86 is moresecurely carried out, while in the safety device 4 shown in FIG. 10, the solder 82 is soon stopped by the resist film 92 connected to the exposed conductor 96 having a smaller diameter. Provided that an amount of the solder 82 is the same compared to the safety device 4, the gap 87 can be situated nearer to the through-hole. In addition, the convex shape portion 84 of the solder 82 can be formed sufficiently large in order to connect electrodes 85 and 86 more securely by using a large area of the solder, thereby a quick and secure disconnection of the electric circuit can be attained.

A state for using the thermal fuse 88 is not limited to the state, in which the circuit board 98 is set vertically as shown in FIG. 12. For example, the circuit board 98 is set upside down so that the concave shape portion 83 of the solder 82 is situated at a lower side and that the convex shape portion 84 is situated at an upper side. Further, it is possible to use the circuit containing the safety device in such a state that the circuit board 98 is tilted. In any state mentioned above for using the safety device, the molten solder 82 is positively sucked by the exposed conductor 100 and a rate of transfer of the solder 82 is increased, thereby a more quick and secure interruption of the electric circuit can be attained. However, a use of the safety device 5 in a state that the concave shape portion 83 of the solder 82 is at an upper side just as shown in FIG. 11 is impossible and this is also the case of the safety device 4.

In the fourth and fifth preferred embodiments explained with reference to FIGS. 9 to 12, such a construction that the circuit board 80 or 98 is set horizontally, the through-hole 81 in a vertical direction is filled with the molten solder 82, the concave shape portion 83 and the convex shape portion 84 are formed at an upper and lower side of the solder 82, respectively, by using solder's own weight, and an edge 84b of the convex shape portion 84 strides over the gap 87 between both electrodes so as to be connected to both electrodes 85 and 86, is also an effective process for producing a safety device of an electric circuit.

According to the process mentioned above, the concave shape portion 83 and the convex shape portion 84 can be formed easily and securely by using solder's own weight and the solder 82 is positively adsorbed to both electrodes 85 and 86 at the lower side (the opposite side) of the circuit board, thereby an electrical connection between electrodes 85 and 86 can be improved.

In comparison with the first to third preferred embodiments, according to the fourth and fifth preferred embodiments, being free from a deterioration and peel of the resist film 40 (FIG. 1) upon extraordinarily high temperature, the electrical connection between the electrodes 85 and 86 is cut off when the solder 82 melts, and the electric circuit is cut off, thereby improving reliability of the thermal fuse 88. That is, according to the first to third preferred embodiments, the peeling of the resist film 40 (see FIG. 1) allows the solder 34 to be sucked into openings between the resist film 40 and the conductor 31 (see FIG. 1) formed on the circuit board 10, thereby a separation of the solder 34 toward both electrodes 31a and 32a is promoted, while according to the fourth and fifth preferred embodiments, without waiting a peeling of the resist film 93, the solder 82 is sucked into the through-hole 81 upon melting of the solder 82, thereby the electrical connection between the electrodes 85 and 86 is quickly cut off.

The aforementioned preferred embodiments are described to aid in understanding the present invention and variations may be made by one skilled in the art without departing from the spirit and scope of the present invention.

As mentioned above, according to the safety device of an electric circuit of the present invention, even when the first protective means in the overcurrent protector is extraordinarily overheated, an accident is securely prevented from occurring by using the second protective means including the thermal fuse. The thermal fuse can quickly operate when the overcurrent protector is extraordinarily overheated. Furthermore, according to the process for producing the safety device of an electric circuit of the present invention, the thermal fuse can be easily formed by employing an automatic soldering machine and the like.

What is claimed is:

1. A safety device of an electric circuit comprising:

first protective means in an overcurrent protector for protecting the electric circuit from an overcurrent, which generates heat to increase its electrical resistance when an overcurrent flows in the electric circuit, whereby reducing or cutting off the overcurrent; and second protective means including a thermal fuse situated in the vicinity of the overcurrent protector comprising:

a first electrode having a first conductor pattern connected to the overcurrent protector;

a second electrode having a second conductor pattern insulated from the first electrode by a gap; and solder connecting the first and second electrodes and melting by heat from the overcurrent protector so as to split into two parts toward the first and second electrodes, wherein the second conductor pattern for forming the thermal fuse is formed on one side of the circuit board and connected to the second electrode having an island shape formed on an opposite side of the circuit board through a through-hole, the first electrode continuously surrounds the second electrode with a gap between the first and second electrodes on the opposite side of the circuit board, and solder connects the first and second electrodes.

2. The safety device of an electric circuit according to claim 1, wherein resist films around the thermal fuse can be peeled off by the heat from the overcurrent protector.

3. The safety device of an electric circuit according to claim 1, wherein the thermal fuse is disposed at substantially the level of the overcurrent protector or a higher level than that of the overcurrent protector when a circuit board, on which the overcurrent protector and the thermal fuse are mounted, is set vertically.

4. The safety device of an electric circuit according to claim 2, wherein the thermal fuse is disposed at substantially the level of the overcurrent protector or a higher level than that of the overcurrent protector when a circuit board, on which the overcurrent protector and the thermal fuse are mounted, is set vertically.

5. The safety device of an electric circuit as defined in any one of claims 1–4, wherein the gap between the first and second electrodes for forming the thermal fuse is provided with a hole, a lead of an electric component is inserted in the hole, and the first and second electrodes together with the lead are connected by solder.

6. The safety device of an electric circuit according to claim 5, wherein the electric component is the overcurrent protector.

7. The safety device of an electric circuit as defined in any one of claims 1–4, wherein the second electrode for forming the thermal fuse is formed to have an island shape at the periphery of a hole for inserting a lead of an electric component therein, the first electrode continuously surrounds the second electrode with a gap between the first and second electrodes, and solder connects the first electrode, the second electrode and the lead of the electric component inserted in the hole.

8. The safety device of an electric circuit as defined in any one of claims 1–4, wherein the first electrode for forming the thermal fuse is formed to have an island shape at the periphery of a hole for inserting a lead of the overcurrent protector therein, the second electrode continuously surrounds the first electrode with a gap between the first and second electrodes, and solder connects the first electrode, the second electrode and the lead of the overcurrent protector inserted in the hole.

9. The safety device of an electric circuit as defined in any one of claims 1–4, wherein the overcurrent protector is a positive temperature coefficient element.

10. A process for producing the safety device of an electric circuit defined in claim 5, characterized in that soldering for connecting the first and second electrodes to form the thermal fuse is performed simultaneously with soldering of electric components including the overcurrent protector on the circuit board by employing an automatic soldering machine.

11. The safety device of an electric circuit according to claim 1, wherein a through-hole of a circuit board is filled with solder, the solder has a concave shape at one opening of the through-hole and a convex shape at an opposite opening of the through-hole, and the convex-shape solder connects the first and second electrodes.

12. The safety device of an electric circuit according to claim 11, wherein an inner diameter of the through-hole is larger than a thickness of the circuit board.

13. The safety device of an electric circuit according to claim 11 or 12, wherein an outer diameter of an exposed conductor on the circuit board at the concave-shape solder side is larger than an outer diameter of the second electrode at least near to the through-hole.

14. The safety device of an electric circuit according to claim 11 or 12, wherein the circuit board is arranged vertically or arranged so as to set the convex-shape solder up.

15. A process for producing the safety device of an electric circuit defined in claim 11 or 12 characterized in that the circuit board is arranged horizontally and the through-hole extending vertically is filled with molten solder, whereby the concave shape and the convex shape are formed at respective sides with its own weight.

* * * * *